United States Patent
Nguyen et al.

(10) Patent No.: US 6,925,626 B2
(45) Date of Patent: Aug. 2, 2005

(54) METHOD OF ROUTING A REDISTRIBUTION LAYER TRACE IN AN INTEGRATED CIRCUIT DIE

(75) Inventors: Ken Nguyen, San Jose, CA (US); Wei Huang, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 134 days.

(21) Appl. No.: 10/640,738

(22) Filed: Aug. 13, 2003

(65) Prior Publication Data

US 2005/0039154 A1 Feb. 17, 2005

(51) Int. Cl.[7] .............................................. G06F 17/50
(52) U.S. Cl. ...................................................... 716/12
(58) Field of Search ................................. 716/12–14

(56) References Cited

U.S. PATENT DOCUMENTS 6,230,306 B1 * 5/2001 Raspopovic et al. .......... 716/13
6,810,512 B2 * 10/2004 Roohparvar ................... 716/13
6,826,741 B1 * 11/2004 Johnson et al. ................ 716/12

\* cited by examiner

*Primary Examiner*—Stacy A. Whitmore
(74) *Attorney, Agent, or Firm*—Fitch, Even, Tabin & Flannery

(57) ABSTRACT

A method of routing a metal layer trace in an integrated circuit die includes steps of: (a) receiving as input a netlist of an integrated circuit die; (b) selecting a redistribution layer trace from the netlist for routing the redistribution layer trace between an I/O pad of the integrated circuit die and a termination point; (c) comparing a trace width of the redistribution layer trace with a maximum trace width limit; and (d) if the trace width of the redistribution layer trace exceeds the maximum trace width limit, then routing the redistribution layer trace as a plurality of separate parallel traces each having a trace width that is less than the selected maximum trace width limit.

12 Claims, 4 Drawing Sheets

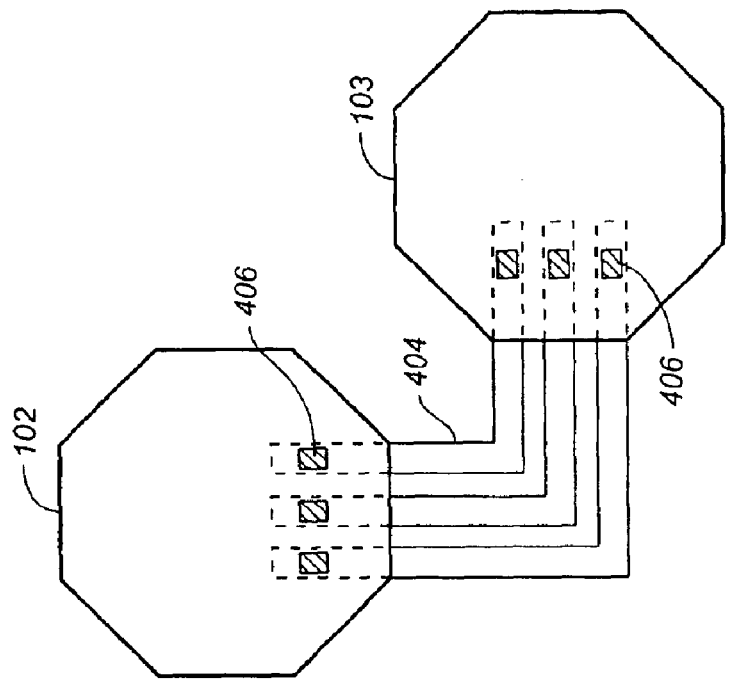
FIG._5
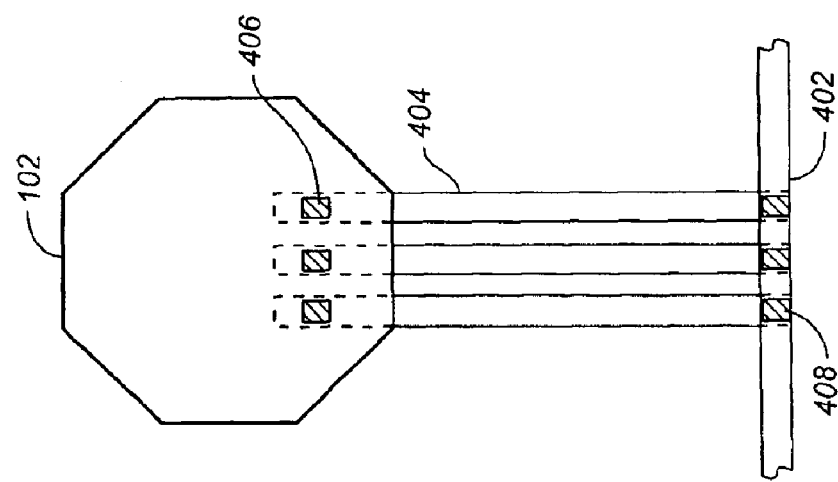
FIG._4
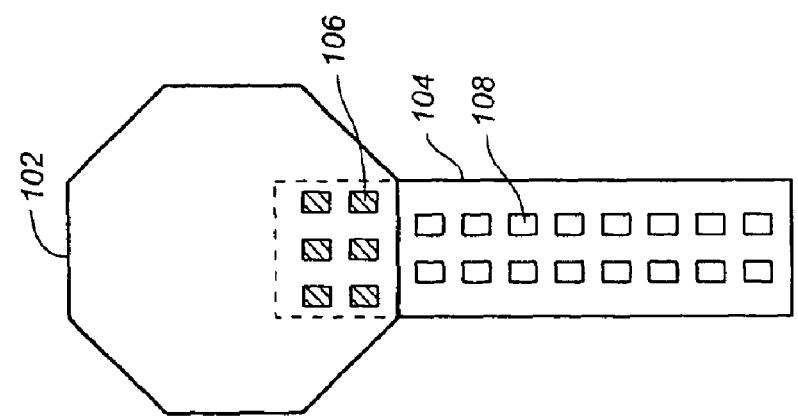
FIG._1
*(PRIOR ART)*

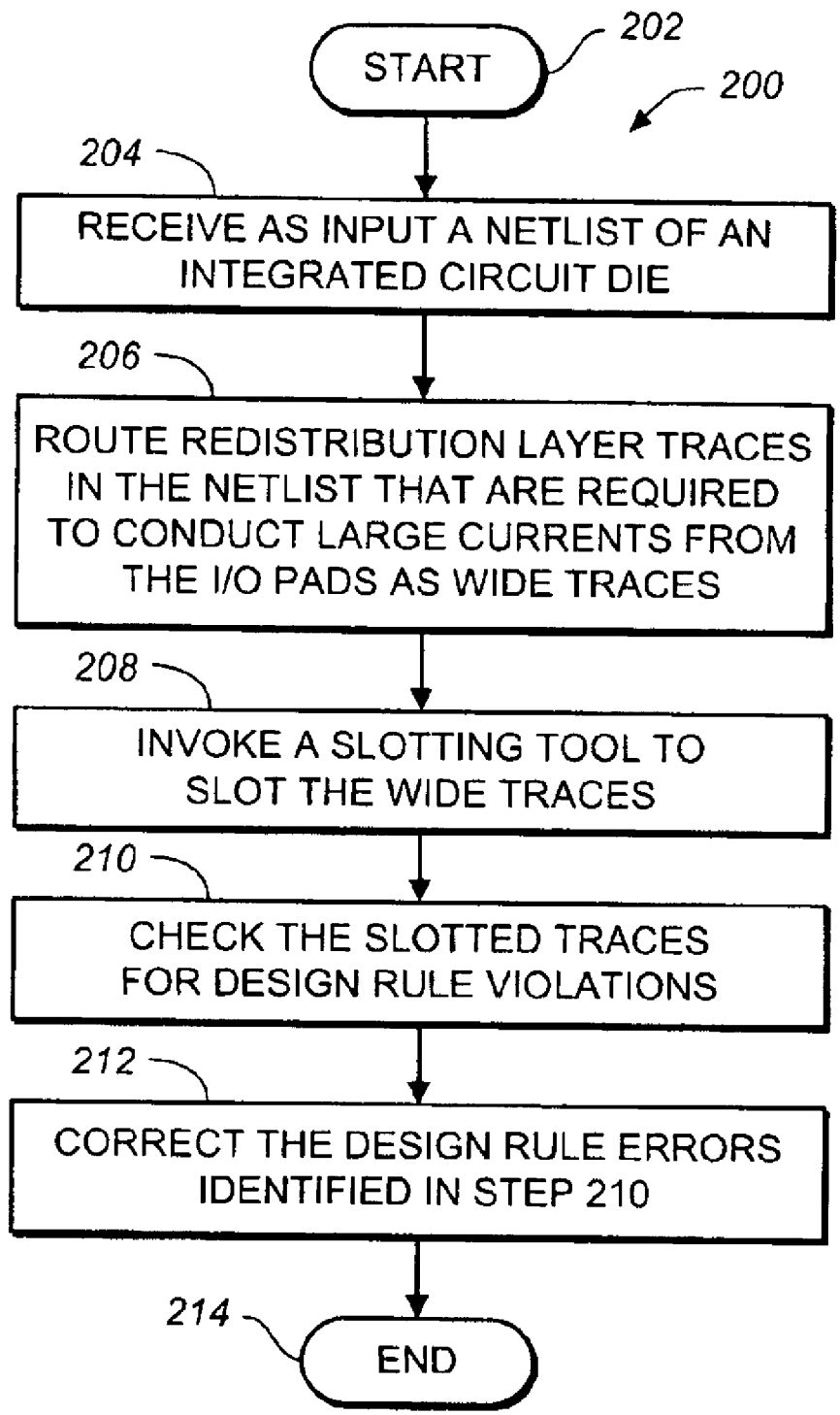
FIG._2
(PRIOR ART)

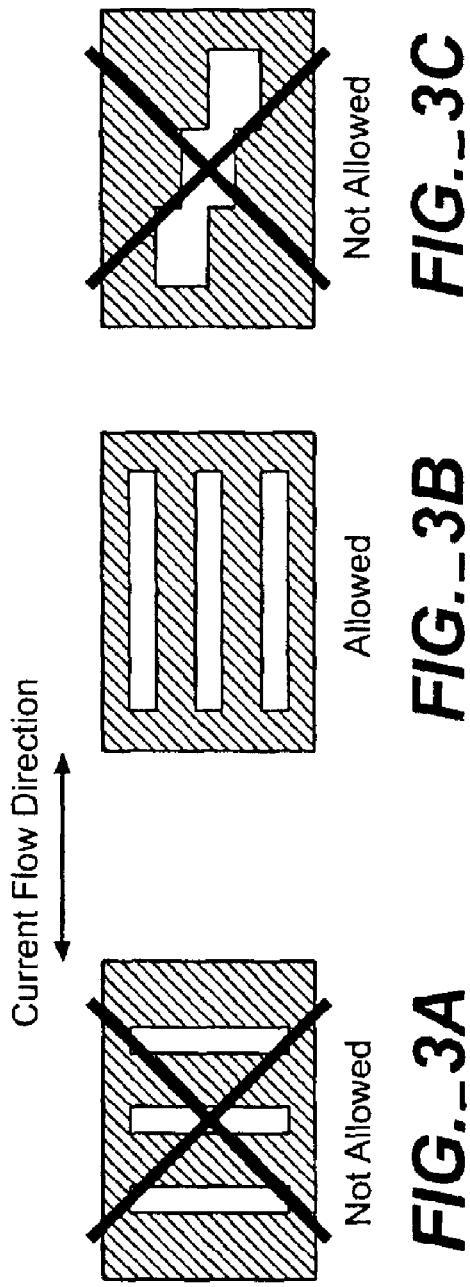
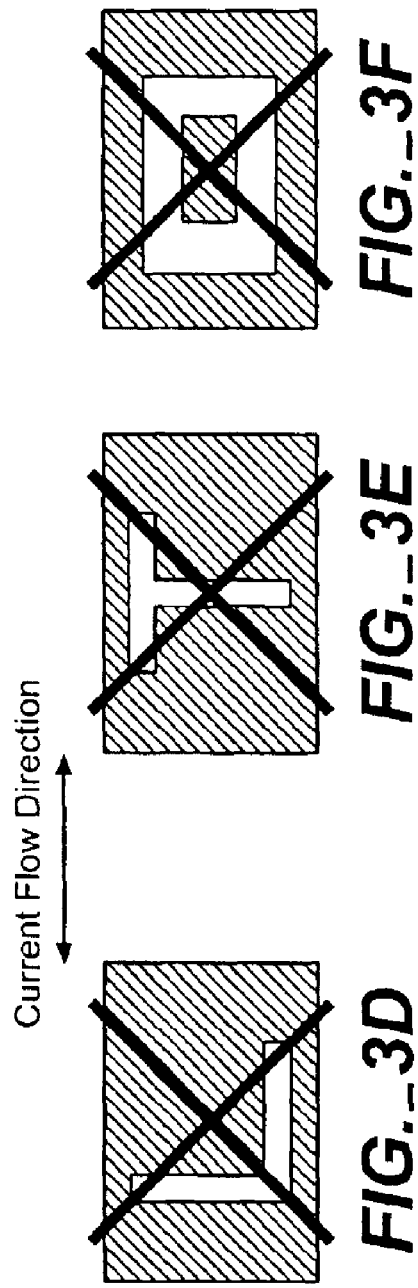

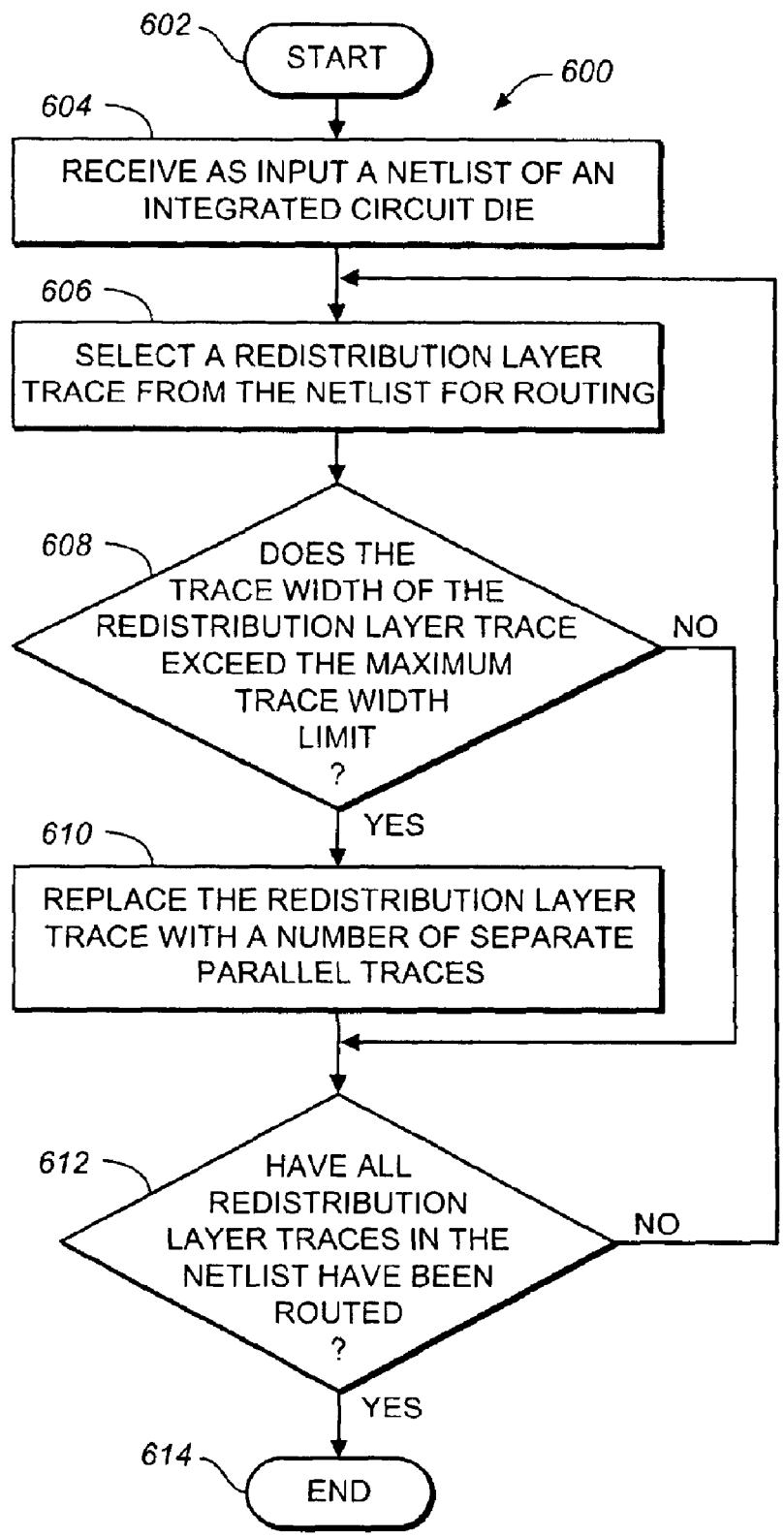
FIG._6

METHOD OF ROUTING A REDISTRIBUTION LAYER TRACE IN AN INTEGRATED CIRCUIT DIE

BACKGROUND OF THE INVENTION

1. Field of the Invention

The present invention relates generally to the design of flip-chip packages used in the manufacture of integrated circuits. More specifically, but without limitation thereto, the present invention relates to routing traces in a redistribution layer of an integrated circuit die.

2. Description of Related Art

A redistribution layer is a conductive metal layer formed on an integrated circuit die in which traces are formed that connect various signals and power between structures in the interior of the die and I/O pads formed on the surface of the die. Due to limitations in current integrated circuit manufacturing processes, traces wider than, for example, 12 microns and longer than 30 microns, depending on the technology, are generally slotted to maintain the trace area within a specified limit imposed by the fabrication process. Disadvantageously, the slotting layout tool typically generates design rule violations, for example, objects having a width less than the minimum width set for the redistribution layer, notches smaller than the minimum distance required between objects on the same redistribution layer, and objects on the same redistribution layer having a spacing that is less than the minimum spacing required between objects on the same redistribution layer. The design rule violations are typically detected and reported by a design rule checker (DRC) tool. Often, manual changes to the design are required to correct the errors, which increases the design cycle time and the production costs.

SUMMARY OF THE INVENTION

In one aspect of the present invention, a method of routing a redistribution layer trace in an integrated circuit die includes steps of: (a) receiving as input a netlist of an integrated circuit die; (b) selecting a redistribution layer trace from the netlist for routing the redistribution layer trace between an I/O pad of the integrated circuit die and a termination point; (c) comparing a trace width of the redistribution layer trace with a maximum trace width limit; and (d) if the trace width of the redistribution layer trace exceeds the maximum trace width limit, then routing the redistribution layer trace as a plurality of separate parallel traces each having a trace width that is less than the selected maximum trace width limit.

In another aspect of the present invention, a computer program product for routing a redistribution layer trace in an integrated circuit die includes:

a medium for embodying a computer program for input to a computer; and a computer program embodied in the medium for causing the computer to perform steps of:

(a) receiving as input a netlist of an integrated circuit die;

(b) selecting a redistribution layer trace from the netlist for routing the redistribution layer trace between an I/O pad of the integrated circuit die and a termination point;

(c) comparing a trace width of the redistribution layer trace with a maximum trace width limit; and (d) if the trace width of the redistribution layer trace exceeds the maximum trace width limit, then routing the redistribution layer trace as a plurality of separate parallel traces each having a trace width that is less than the selected maximum trace width limit.

BRIEF DESCRIPTION OF THE DRAWINGS

The present invention is illustrated by way of example and not limitation in the accompanying figures, in which like references indicate similar elements throughout the several views of the drawings, and in which:

FIG. 1 illustrates a slotted redistribution layer trace of the prior art;

FIG. 2 illustrates a flow chart of a typical method for routing the redistribution layer trace of FIG. 1;

FIGS. 3A, 3B, 3C, 3D, 3E, and 3F illustrate examples of typical geometric slotting rules according to the prior art;

FIG. 4 illustrates a method of routing a redistribution layer trace between an I/O pad and a power mesh of an integrated circuit die according to an embodiment of the present invention;

FIG. 5 illustrates a method of routing a redistribution layer trace between two I/O pads of an integrated circuit die according to an embodiment of the present invention; and FIG. 6 illustrates a flow chart of a method of routing a redistribution layer trace in an integrated circuit die according to an embodiment of the present invention.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

Connections to and from an integrated circuit die generally conduct power and signals from I/O (input/output) pads formed in the top metal layer of the integrated circuit die. The I/O pads are connected to wires or traces formed in one or two lower metal layers of the die, called redistribution layers, by vias formed between the top metal layer and the redistribution layers. The redistribution layer traces are connected to power meshes and other structures in the lowest layers of the integrated circuit die by vias formed between the redistribution layers and the lowest layers, or the redistribution layer traces may be connected by vias formed between the redistribution layers and the top metal layer to other I/O pads. In forming the redistribution layer traces, limitations of the fabrication process in recently developed semiconductor technology require that the metal area of a trace be maintained within specified limits to control the thickness of the trace. The metal area of a trace wider than 12 microns, for example, is typically controlled by removing a pattern of metal from the trace after the trace layout generation step has been performed. The metal patterning step is called slotting.

A slotting tool is a utility developed to generate a slotting pattern in traces that would otherwise exceed the metal area limitation imposed by the fabrication process. The slotting pattern generally conforms to a set of design rules, for example, a minimum allowed spacing from the outside metal edge of a trace to the nearest slot, a maximum allowed spacing from the outside metal edge of a trace to the nearest slot, a maximum allowed metal density of a trace after slotting, a minimum allowed metal density of a trace after slotting, and limitations on the geometry of the slotting pattern. Disadvantageously, the slotting tool requires a separate step in the trace generation process, lengthening the runtime required to generate an integrated circuit die design.

FIG. 1 illustrates a typical slotted redistribution layer trace of the prior art. Shown in FIG. 1 are an I/O pad 102 of an integrated circuit die, a redistribution layer trace 104, vias 106, and slots 108.

In FIG. 1, the power distribution trace 104 is connected to the I/O pad 102 by the vias 108. Because the power distribution trace 104 has a width that exceeds the metal area limitation of the fabrication process, the slots 108 are patterned in the power distribution trace 104 to reduce the metal area of the power distribution trace 104. Disadvantageously, the slots 108 increase the electrical resistance of the power distribution trace 104. Also, the addition of the slots 108 frequently results in design rule violations, as explained below.

FIG. 2 illustrates a flow chart 200 of a typical method for routing the power distribution trace of FIG. 1.

Step 202 is the entry point of the flow chart 200.

In step 204, a netlist of an integrated circuit die is received as input.

In step 206, redistribution layer traces in the netlist that are required to conduct large currents from the I/O pads are routed as wide traces.

In step 208, if the trace width of the redistribution layer traces exceeds a maximum trace width limit, then a slotting tool is invoked to slot the wide traces as illustrated in FIG. 1.

In step 210, a design rule checker checks the slotted traces for design rule violations, for example, less than the minimum allowed spacing from the outside metal edge of a trace to the nearest slot, more than the maximum allowed spacing from the outside metal edge of a trace to the nearest slot, less than the minimum allowed metal density of a trace after slotting, and geometric rule violations. Unfortunately, design rule check errors are extremely common in slotted traces.

FIGS. 3A, 3B, 3C, 3D, 3E, and 3F illustrate examples of typical geometric slotting rules according to the prior art.

In FIG. 3A, slots having a longer dimension that is not in the direction of the current flow are not allowed.

In FIG. 3B, if the slots have a longer dimension, then the longer dimension must follow the direction of current flow.

In FIGS. 3C, 3D, and 3E, slots that include a right angle are not allowed.

In FIG. 3F, slots that include metal enclosed by the slot are not allowed.

In step 212, the design rule errors identified in step 210 are manually corrected, often at considerable added cost.

Step 214 is the exit point of the flow chart 200.

The present invention advantageously avoids the problems associated with slotting while maintaining trace widths within the maximum trace width limit for any desired technology. In one aspect of the present invention, a method of routing a redistribution layer trace in an integrated circuit die includes steps of: (a) receiving as input a netlist of an integrated circuit die; (b) selecting a redistribution layer trace from the netlist for routing the redistribution layer trace between an I/O pad of the integrated circuit die and a termination point; (c) comparing a trace width of the redistribution layer trace with a maximum trace width limit; and (d) if the trace width of the redistribution layer trace exceeds the maximum trace width limit, then routing the redistribution layer trace as a plurality of separate parallel traces each having a trace width that is less than the selected maximum trace width limit.

FIG. 4 illustrates a method of routing a redistribution layer trace between an I/O pad and a power mesh of an integrated circuit die according to an embodiment of the present invention. Shown in FIG. 4 are an I/O pad 102, a power mesh 402, parallel traces 404, and vias 406 and 408.

In FIG. 4, if a redistribution layer trace in the netlist exceeds the maximum trace width limit, for example, 12 microns, then the redistribution layer trace is routed by replacing the single wide trace by the separate parallel traces 404. The parallel traces 404 may each have the same width and spacing as the standard trace width and spacing used in the floorplan of the integrated circuit die according to well-known techniques, or each of the parallel traces 404 may have another selected width that is less than the maximum trace width limit to practice various embodiments of the present invention to suit specific applications within the scope of the appended claims.

The same design rules may be applied by the router to each of the parallel traces 404 that are applied to the other traces in the floorplan during routing according to well-known techniques. Because the separate parallel traces 404 replace the wide redistribution layer traces, no slotting step is needed. Advantageously, all design rules may be considered during the routing of the parallel traces 404, therefore no design rule check errors should be present after routing the parallel traces 404. Further, no manual correction should be necessary, however, a design rule check may be useful to ensure that no design rule check errors have occurred during routing.

FIG. 5 illustrates a method of routing a redistribution layer trace between two I/O pads of an integrated circuit die according to an embodiment of the present invention. Shown in FIG. 5 are a I/O pads 102 and 103, parallel traces 404, and vias 406.

Two or more I/O pads may be connected as shown in FIG. 5 to the same parallel traces 404 to reduce current density in each of the I/O pads or to provide a jumper between two or more I/O pads.

FIG. 6 illustrates a flow chart 600 of a method of routing a metal layer trace in an integrated circuit die according to an embodiment of the present invention.

Step 602 is the entry point of the flow chart 600.

In step 604, a netlist of an integrated circuit die is received as input according to well-known techniques. The netlist describes all the connections for routing the floorplan of the integrated circuit die, including routing redistribution layer traces from the I/O pads to termination points in the integrated circuit die. The termination points are typically vias that connect the I/O pad to power meshes in the lower metal layers as illustrated in the example of FIG. 4, however, the termination points may also be vias that connect an I/O pad, for example, to another I/O pad as illustrated in the example of FIG. 5.

In step 606, a redistribution layer trace is selected from the netlist for routing.

In step 608, if the redistribution layer trace width required to conduct the current specified in the netlist exceeds a maximum trace width limit, then control is transferred to step 610. Otherwise, control is transferred to step 614.

In step 610, the redistribution layer trace is routed as a number of separate parallel traces 404, for example, as shown in FIG. 4. The maximum trace width limit depends on the technology used for making the integrated circuit die. Redistribution layer traces used to conduct large currents, for example, power and ground traces, are assigned a trace width in the netlist that may exceed the maximum trace width limit, especially if the length of the redistribution layer trace exceeds about 30 microns. A typical maximum trace width limit is 12 microns.

For example, the trace width of each of the parallel traces 404 may be identical to the standard trace width used for the signal traces in the integrated circuit die. The separate parallel traces 404 are connected in parallel to the I/O pad 102 by the vias 406 and to the power mesh 402 by the vias 408. The separate parallel traces 404 preferably have a parallel geometry as shown in FIG. 4, that is, each of the parallel traces 404 has a substantially equal spacing with respect to each of the other parallel traces 404 connecting the same I/O pad 102 to the same termination point.

Each of the separate parallel traces 404 has a trace width that is less than or equal to the maximum trace width limit. The number of separate parallel traces 404 used to replace each wide redistribution layer trace is preferably selected so that the total electrical resistance of the parallel traces 404 does not exceed the electrical resistance of the original wide redistribution layer trace. For example, if the original wide redistribution layer trace had a trace width of 22 microns, then two parallel traces 402 each having a trace width of 11 microns may be used to replace the original wide redistribution layer trace. The combined area of two parallel traces each having a trace width of 11 microns is equal to that of a single trace having a trace width of 22 microns, therefore the total resistance of the parallel traces 404 does not exceed that of the original wide redistribution layer trace. Also, the parallel trace width of 11 microns does not exceed the maximum trace width limit of 12 microns. The total width of the parallel traces 404 includes the width between traces, which is taken into account during routing to maintain proper grid spacing between each of the traces routed in the floorplan of the integrated circuit die.

The same design rules used to route the redistribution layer traces may be used to route the parallel traces 404. As a result, there should be no design rule violations and no manual correction required.

In step 612, if all redistribution layer traces in the netlist have been routed, control is transferred to step 614. Otherwise, control is transferred to step 606 to select another redistribution layer trace.

Step 614 is the exit point of the flow chart 600.

An important feature of the present invention is that the routing information generated for a wide redistribution layer trace may be used to generate the separate parallel traces, with allowances made for the greater die area needed to accommodate both the trace width and the trace spacing of the separate parallel traces.

Another important feature of the present invention is that no slotting need be performed to meet the metal area limitations of the redistribution layer fabrication process.

Although the method of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

The steps described above with regard to the flow chart 600 may also be implemented by instructions performed on a computer according to well-known programming techniques.

In another aspect of the present invention, a computer program product for routing a redistribution layer trace in an integrated circuit die includes:
 a medium for embodying a computer program for input to a computer; and
 a computer program embodied in the medium for causing the computer to perform steps of:
  (a) receiving as input a netlist of an integrated circuit die;
  (b) selecting a redistribution layer trace from the netlist for routing the redistribution layer trace between an I/O pad of the integrated circuit die and a termination point;
  (c) comparing a trace width of the redistribution layer trace with a maximum trace width limit; and
  (d) if the trace width of the redistribution layer trace exceeds the maximum trace width limit, then routing the redistribution layer trace as a plurality of separate parallel traces each having a trace width that is less than the selected maximum trace width limit.

While the invention herein disclosed has been described by means of specific embodiments and applications thereof, numerous modifications and variations could be made thereto by those skilled in the art without departing from the scope of the invention set forth in the following claims.

What is claimed is:

1. A method of routing a redistribution layer trace in an integrated circuit die comprising steps of:
 (a) receiving as input a netlist of an integrated circuit die;
 (b) selecting a redistribution layer trace from the netlist for routing the redistribution layer trace between an I/O pad of the integrated circuit die and a termination point;
 (c) comparing a trace width of the redistribution layer trace with a selected maximum trace width limit; and
 (d) if the trace width of the redistribution layer trace exceeds the selected maximum trace width limit, then routing the redistribution layer trace as a plurality of separate parallel traces each having a trace width that is less than the selected maximum trace width limit.

2. The method of claim 1 wherein step (d) comprises routing the plurality of separate parallel traces at a substantially equal spacing relative to one another.

3. The method of claim 1 wherein step (d) comprises selecting a trace width for each of the plurality of separate parallel traces so that a total electrical resistance of the plurality of separate parallel traces is no greater than an electrical resistance of the redistribution layer trace.

4. The method of claim 1 wherein step (d) comprises selecting a trace width for each of the plurality of separate parallel traces that is less than or equal to about 12 microns.

5. The method of claim 1 wherein step (d) comprises selecting a total area of the plurality of separate parallel traces that at least equal to a total area of the redistribution layer trace.

6. The method of claim 1 wherein the termination point is a plurality of vias connecting the plurality of separate parallel traces to another I/O pad of the integrated circuit die.

7. A computer program product for routing a redistribution layer trace in an integrated circuit die includes:
 a medium for embodying a computer program for input to a computer; and
 a computer program embodied in the medium for causing the computer to perform steps of:
  (a) receiving as input a netlist of an integrated circuit die;
  (b) selecting a redistribution layer trace from the netlist for routing the redistribution layer trace between an I/O pad of the integrated circuit die and a termination point;

(c) comparing a trace width of the redistribution layer trace with a selected maximum trace width limit; and (d) if the trace width of the redistribution layer trace exceeds the selected maximum trace width limit, then routing the redistribution layer trace as a plurality of separate parallel traces each having a trade width that is less than the selected maximum trace width limit.

8. The computer program product of claim 7 wherein step (d) comprises routing the plurality of separate parallel traces at a substantially equal spacing relative to one another.

9. The computer program product of claim 7 wherein step (d) comprises selecting a trace width for each of the plurality of separate parallel traces so that a total electrical resistance of the plurality of separate parallel traces is no greater than an electrical resistance of the redistribution layer trace.

10. The computer program product of claim 7 wherein step (d) comprises selecting a trace width for each of the plurality of separate parallel traces that is less than or equal to about 12 microns.

11. The computer program product of claim 7 wherein step (d) comprises selecting a total area of the plurality of separate parallel traces that is at least equal to a total area of the redistribution layer trace.

12. The computer program product of claim 7 wherein the termination point is a plurality of vias connecting the plurality of separate parallel traces to another I/O pad of the integrated circuit die.

\* \* \* \* \*